(12) United States Patent
Nouda et al.

(10) Patent No.: US 11,228,305 B2
(45) Date of Patent: Jan. 18, 2022

(54) LOAD DRIVE CIRCUIT CONFIGURED TO PREVENT A FLYBACK CURRENT

(71) Applicant: Sumitomo Wiring Systems, Ltd., Yokkaichi (JP)

(72) Inventors: Shinji Nouda, Yokkaichi (JP); Yutaka Higuchi, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 16/770,339

(22) PCT Filed: Nov. 22, 2018

(86) PCT No.: PCT/JP2018/043245
§ 371 (c)(1),
(2) Date: Jun. 5, 2020

(87) PCT Pub. No.: WO2019/111734
PCT Pub. Date: Jun. 13, 2019

(65) Prior Publication Data
US 2020/0366278 A1    Nov. 19, 2020

(30) Foreign Application Priority Data

Dec. 6, 2017 (JP) .............................. JP2017-234251

(51) Int. Cl.
*H02H 5/10* (2006.01)
*H03K 17/0812* (2006.01)
(Continued)

(52) U.S. Cl.
CPC ......... *H03K 17/0812* (2013.01); *H02H 3/003* (2013.01); *H02H 5/105* (2013.01); *H02M 3/1555* (2021.05)

(58) Field of Classification Search
CPC .......... H02H 5/105; H02H 5/10; H02H 3/003; H02M 3/1555; H02M 1/32; H02M 3/155; H03K 17/0812
See application file for complete search history.

(56) References Cited

U.S. PATENT DOCUMENTS 5,483,404 A    1/1996  Nakano
7,881,035 B2 *  2/2011  Takahashi ............... F04B 49/06
                                                361/152

(Continued)

FOREIGN PATENT DOCUMENTS

JP    H11-308780 A    11/1999
JP    2005269748 A    9/2005
JP    2017-028417 A   2/2017

OTHER PUBLICATIONS

International Search Report, Application No. PCT/JP02018/43245, dated Feb. 26, 2019. ISA/Japan Patent Office.
(Continued)

Primary Examiner — Harry R Behm
(74) Attorney, Agent, or Firm — Honigman LLP

(57) ABSTRACT

A load drive circuit includes a power source terminal ("PST"), a power source and a load terminal connecting a load to the power source. A semiconductor switch connects the PST to the load terminal. A control circuit includes an output terminal for opening/closing the semiconductor switch. A freewheeling circuit includes a freewheeling diode and a protection switch blocks a current from the power source to the semiconductor switch when the power source is connected in a reverse manner. A first terminal connects the control circuit to a first fixed potential and a second terminal connects an anode of the freewheeling diode to a second fixed potential. A connection circuit includes a connection switch connecting the output terminal and the first terminal. The connection circuit connects the output (Continued)

terminal to the first terminal when a rise in a potential difference between the first terminal and the second terminal is detected.

8 Claims, 5 Drawing Sheets

(51) Int. Cl.
*H02H 3/00* (2006.01)
*H02M 3/155* (2006.01)

(56) References Cited

U.S. PATENT DOCUMENTS

| | | | |
|---|---|---|---|
| 8,000,070 B2* | 8/2011 | Muhlenbein | H02H 11/003 |
| | | | 361/84 |
| 2004/0057183 A1* | 3/2004 | Vincent | H01F 7/18 |
| | | | 361/118 |
| 2005/0210866 A1 | 9/2005 | Ito et al. | |
| 2008/0247108 A1 | 10/2008 | Ando et al. | |
| 2009/0109588 A1* | 4/2009 | Hayama | G01R 31/58 |
| | | | 361/93.1 |
| 2010/0208401 A1 | 8/2010 | Kimoto | |
| 2015/0137714 A1 | 5/2015 | Kim | |
| 2016/0241013 A1 | 8/2016 | Togo Peraza et al. | |

OTHER PUBLICATIONS

Extended European Search Report, Application No. 18 88 6768, dated Dec. 23, 2020.

* cited by examiner

LOAD DRIVE CIRCUIT CONFIGURED TO PREVENT A FLYBACK CURRENT

CROSS-REFERENCE TO RELATED APPLICATIONS

This application is the U.S. national stage of PCT/JP2018/043245 filed on Nov. 22, 2018, which claims priority of Japanese Patent Application No. 2017-234251 filed on Dec. 6, 2017, the contents of which are incorporated herein.

TECHNICAL FIELD

The present disclosure relates to a load drive circuit.

BACKGROUND

A technique disclosed e.g. in JP 2010-044521A has been known as a conventional technique for protecting a semiconductor switch for switching current supply from a power source to a load. JP 2010-044521A describes circulating, from ground, induction energy generated by an inductance of a dielectric load such as a motor when power supply to the load is stopped, and thereby protecting a semiconductor switch against the induction energy.

However, there has been a problem in that, if an earth bolt is detached in a state where the ground of a common splice load is fastened with that bolt, at the same earth point as the ground of a load drive circuit, a flyback current flows from the common splice load to a freewheeling diode in the load drive circuit.

An object of the present disclosure is to provide a load drive circuit that can prevent a flyback current from a common splice load to a freewheeling diode.

SUMMARY

A load drive circuit according to one aspect of the present disclosure include: a power source terminal for connecting a power source; a load terminal for connecting a load to which power is to be supplied from the power source connected to the power source terminal; a semiconductor switch connected between the power source terminal and the load terminal; a freewheeling circuit that includes: a freewheeling diode connected to the semiconductor switch, and a protection switch that is connected to the freewheeling diode in series, and, when the power source is connected in a reverse manner, switches off and blocks flow of a current from the power source to the semiconductor switch via the freewheeling diode; a control circuit that includes: a first control terminal for outputting a signal for opening/closing the semiconductor switch, and a second control terminal for outputting a signal for opening/closing the protection switch; a first terminal for connecting the control circuit to a first fixed potential; a second terminal for connecting an anode of the freewheeling diode to a second fixed potential via the protection switch; and a connection circuit that includes a connection switch installed in a conductive path that connects the second control terminal and the first terminal, and when a rise in a potential difference between the first terminal and the second terminal is detected, the connection circuit connects the second control terminal and the first terminal by switching on the connection switch.

Advantageous Effects of Disclosure

According to the foregoing description, it is possible to prevent a flyback current from a common splice load to a freewheeling diode.

DETAILED DESCRIPTION OF PREFERRED EMBODIMENTS

Figure 1:
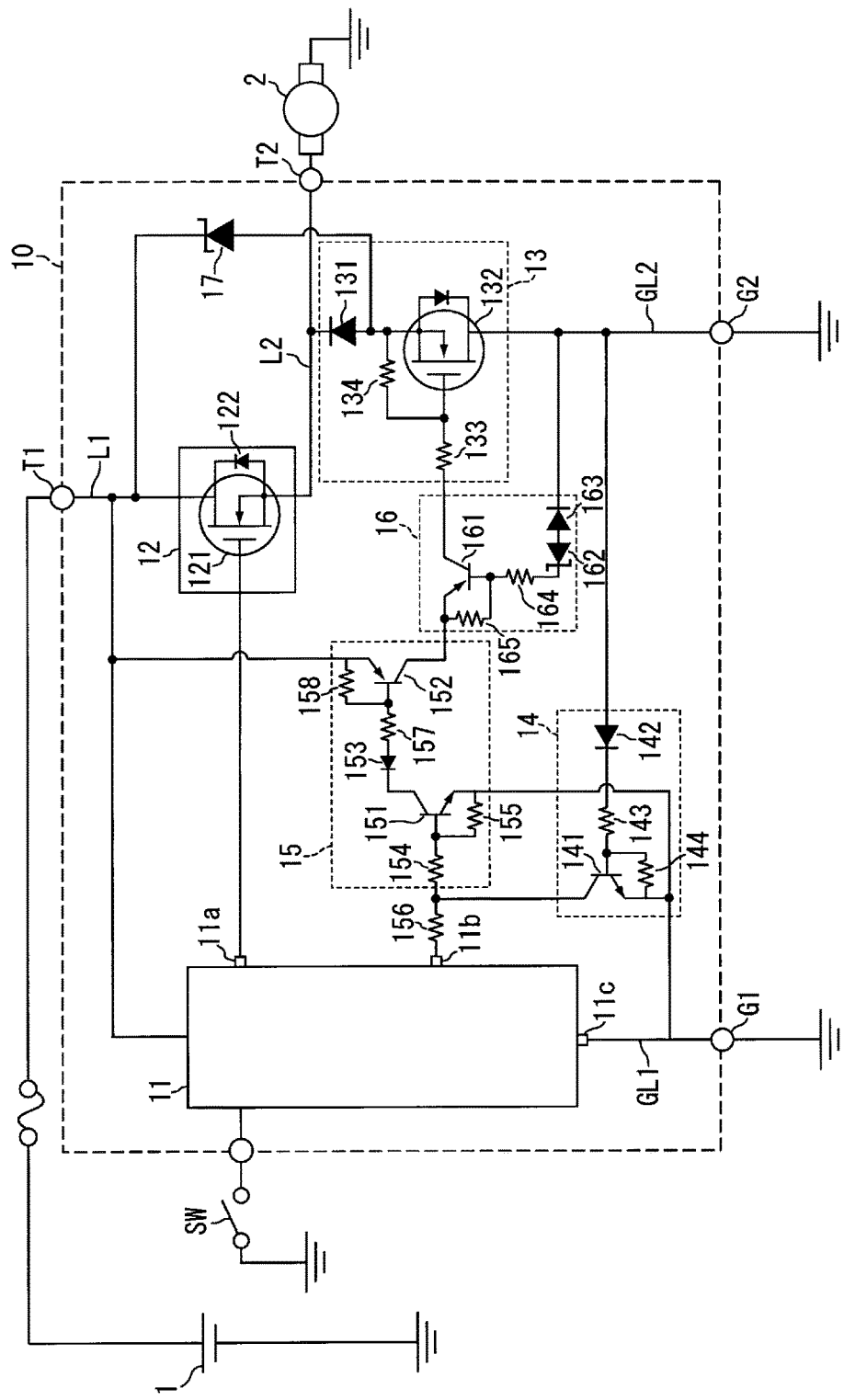
FIG. 1 is a circuit diagram showing a configuration of a load drive circuit according to a first embodiment.

Embodiments of the present disclosure will be listed below. In addition, at least a portion of the embodiments described below may be suitably combined.

A load drive circuit according to one aspect of the present disclosure includes: a power source terminal for connecting a power source; a load terminal for connecting a load to which power is to be supplied from the power source connected to the power source terminal; a semiconductor switch connected between the power source terminal and the load terminal; a freewheeling circuit that includes: a freewheeling diode connected to the semiconductor switch, and a protection switch that is connected to the freewheeling diode in series, and, when the power source is connected in a reverse manner, switches off and blocks flow of a current from the power source to the semiconductor switch via the freewheeling diode; a control circuit that includes: a first control terminal for outputting a signal for opening/closing the semiconductor switch, and a second control terminal for outputting a signal for opening/closing the protection switch; a first terminal for connecting the control circuit to a first fixed potential; a second terminal for connecting an anode of the freewheeling diode to a second fixed potential via the protection switch; and a connection circuit that includes a connection switch installed in a conductive path that connects the second control terminal and the first terminal, and when a rise in a potential difference between the first terminal and the second terminal is detected, the connection circuit connects the second control terminal and the first terminal by switching on the connection switch.

In the present disclosure, when a rise in the potential difference between the first terminal and the second terminal is detected, the second control terminal and the first terminal are connected by switching on the connection switch, and thus a signal for the protection switch that is output from the control circuit is output to the outside of the load drive circuit via the conductive path that connects the second control terminal and the first terminal. As a result, the protection switch is switched off, and it is possible to avoid a flyback current from a common splice load connected at the same earth point as the second terminal, and prevent the freewheeling diode and the protection switch from being damaged.

In the load drive circuit according to another aspect of the present disclosure, the connection circuit detects a rise in a potential difference that occurs when connection between the second terminal and the second fixed potential is cancelled.

In this aspect, since the connection circuit detects a rise in the potential difference that occurs when connection between the second terminal and the second fixed potential is cancelled, it is possible to avoid a flyback current from a common splice load connected at the same earth point as the second terminal, and prevent the freewheeling diode and the protection switch from being damaged.

The load drive circuit according to another aspect of the present disclosure includes a first blocking circuit that is provided between the second control terminal and the freewheeling circuit, and switches off the protection switch when connection between the first terminal and the first fixed potential is cancelled.

In this aspect, it is possible to perform control so as to switch off the protection switch of the freewheeling circuit if the first terminal to which the control circuit is connected is detached from the earth point. If the semiconductor switch is switched from on to off in a state where the protection switch is switched off, a potential difference that occurs in the semiconductor switch due to induced electromotive force of the load is limited to a certain upper limit value, and thus it is possible to prevent the voltage that the semiconductor switch can withstand from being exceeded.

The load drive circuit according to another aspect of the present disclosure further includes a second blocking circuit that is provided between the first blocking circuit and the freewheeling circuit, and, when a decrease in a potential difference between the power source terminal and the second terminal is detected, switches off the protection switch.

In this aspect, even if the control circuit can transmit a signal for controlling the freewheeling circuit to the first blocking circuit, when both the first terminal and the second terminal are detached from the earth points, and a decrease in the potential difference between the power source and the second terminal can be detected, it is possible to switch off the protection switch of the freewheeling circuit, and thus it is possible to avoid a flyback current from the common splice load, and prevent the freewheeling diode and the protection switch from being damaged.

The load drive circuit according to another aspect of the present disclosure includes a zener diode connected between the protection switch and the power source terminal.

In this aspect, if the semiconductor switch is switched from on to off in a state where the protection switch of the freewheeling circuit is switched off, a potential difference that occurs in the semiconductor switch due to induced electromotive force of the load is limited to the sum (Vzd+Vf4) of a clamp voltage Vzd of the zener diode and a forward voltage Vf4 of the freewheeling diode.

The present disclosure will be described below in detail with reference to the drawings illustrating the embodiments.

First Embodiment

FIG. 1 is a circuit diagram showing a configuration of a load drive circuit 10 according to a first embodiment. The load drive circuit 10 is provided midway on a power supply path extending from a power source 1 to a load 2, and includes, for example, a control circuit 11, a semiconductor switch 12, a freewheeling circuit 13, first to third monitoring circuits 14 to 16, and a zener diode 17. The power source 1 is, for example, a battery of a vehicle, and the load 2 may be a dielectric load such as a fan drive motor for cooling an engine.

The control circuit 11 is a microcomputer, for example, and is configured to start in response to operating an external switch SW. The control circuit 11 controls a switch operation (on/off) of the semiconductor switch 12 using a control signal (power supply control signal) that is output from a control terminal 11a. The power supply control signal is a PWM signal, for example, and the control circuit 11 controls a switch operation of the semiconductor switch 12 by changing the duty ratio of the power supply control signal depending on the load 2. The control circuit 11 also controls the operation of the freewheeling circuit 13 using a control signal (freewheeling circuit control signal) that is output from a control terminal 11b.

Also, the control circuit 11 includes a reset terminal 11c connected to an SGND terminal (signal ground terminal) G1 of the load drive circuit 10. The SGND terminal G1 is connected to a first earth point (first fixed potential) via an earth bolt (not illustrated). In this embodiment, the first fixed potential is a ground potential, but may also be any potential that is used as a reference potential. When the potential at the reset terminal 11c rises to a predetermined value as a result of detachment of the earth bolt due to vehicle vibration or the like, the control circuit 11 switches off the semiconductor switch 12, and resets (initializes) itself.

The semiconductor switch 12 is provided between a power source terminal T1 to which the power source 1 is connected and a load terminal T2 to which the load 2 is connected, and is a switch for connecting or blocking a power supply path between the power source 1 and the load 2 depending on a power supply control signal that is output from the control terminal 11a of the control circuit 11. The semiconductor switch 12 includes a FET (Field-Effect Transistor) 121 and a parasitic diode 122, for example. The FET 121 is an N-channel MOSFET (Metal-Oxide Semiconductor FET), for example, and the drain of the FET 121 is connected to the power source terminal T1 via a power source input line L1, the gate is connected to the control terminal 11a of the control circuit 11, and the source is connected to the load terminal T2 via a power source output line L2.

When the power source 1 is properly connected to the power source terminal T1, and is switched on by a power supply control signal that is output from the control terminal 11a of the control circuit 11, the semiconductor switch 12 connects the power supply path constituted by the power source input lines L1 and the power source output line L2. Accordingly, power is supplied from the power source 1 to the load 2. In addition, the semiconductor switch 12 enables current flow in a direction opposite to current flow when the power source 1 is properly connected, using the parasitic diode 122.

The freewheeling circuit 13 is connected between the source of the FET 121 that is an output end of the semiconductor switch 12 and a PGND terminal (power ground terminal) G2 of the load drive circuit 10, and has a function of protecting the semiconductor switch 12. The PGND terminal G2 is connected via an earth bolt (not illustrated) to a second earth point (second fixed potential) that is different from the above-noted first earth point. The second fixed potential is a ground potential, in this embodiment, but may also be any potential that is used as a reference potential.

The freewheeling circuit 13 includes a freewheeling diode 131 and a FET 132. The cathode of the freewheeling diode 131 is connected to both the semiconductor switch 12 and the load 2, via the power source output line L2 that connects the output end of the semiconductor switch 12 and the load terminal T2, and the anode of the freewheeling diode 131 is connected to the source of the FET 132. In addition, the FET 132 is an N-channel MOSFET, for example, and the source of the FET 132 is connected to the anode of the freewheeling diode 131, the drain is connected to the PGND terminal G2, and the gate is connected to the third monitoring circuit 16, which will be described later. When the load drive circuit 10 is turned on, the FET 132 is switched on by a bias voltage that is generated by a resistor 133 and a resistor 134.

In the freewheeling circuit 13, when the power source 1 is properly connected and the SGND terminal G1 and the PGND terminal G2 are properly connected to the respective earth points, a load current is prevented by the freewheeling diode 131 from flowing into the freewheeling circuit 13. In addition, when the semiconductor switch 12 is switched from on to off, a surge current caused by induced electromotive force in the inductance of the load 2 can be circulated via the freewheeling circuit 13 constituted by the freewheeling diode 131 and the FET 132. Accordingly, the freewheeling circuit 13 can protect the semiconductor switch 12 against the surge.

Furthermore, when the power source 1 is connected in a reverse manner, the FET 132 is switched off, and the freewheeling circuit 13 is not connected electrically, and thus a current in a direction opposite to a current when the power source 1 is properly connected flows through the load 2 and the parasitic diode 122. At this time, a current that depends on the resistance value of the load 2 flows, and a large current such as a short-circuit current does not occur in the load drive circuit 10. Therefore, it is possible to prevent damage of the semiconductor switch 12 when the power source 1 is connected in a reverse manner.

The first monitoring circuit 14 is provided between the SGND terminal G1 and the PGND terminal G2, and includes a transistor 141 and a diode 142. The transistor 141 is an NPN bipolar transistor, for example, and the collector of the transistor 141 is connected to the control terminal 11b of the control circuit 11, the emitter is connected to a ground line GL1, and the base is connected to a ground line GL2 via a resistor 143 and the diode 142. In addition, a resistor 144 is connected between the base and emitter of the transistor 141.

With such a configuration, the first monitoring circuit 14 has a function of detecting a potential difference between the SGND terminal G1 and the PGND terminal G2, and a function of connecting the control terminal 11b of the control circuit 11 to the SGND terminal G1 when a certain potential difference is detected.

The second monitoring circuit 15 is provided between the control circuit 11 and the freewheeling circuit 13, and includes two transistors 151 and 152 and a diode 153 connected between the two transistors 151 and 152.

The transistor 151 is an NPN bipolar transistor, for example, and the collector of the transistor 151 is connected to the other transistor 152 via the diode 153 and a resistor 157, the emitter is connected to the ground line GL1, and the base is connected to the control terminal 11b of the control circuit 11 via resistors 154 and 156. In addition, a resistor 155 is connected between the base and emitter of the transistor 151.

The transistor 152 is a PNP bipolar transistor, for example, and the collector of transistor 152 is connected to the third monitoring circuit 16, the emitter is connected to the power source input line L1, and the base is connected to the collector of the transistor 151 via the resistor 157 and the diode 153. In addition, a resistor 158 is connected between the base and emitter of the transistor 152. The diode 153 on the cathode side is connected to the transistor 151, and the diode 153 on the anode side is connected to the transistor 152.

The third monitoring circuit 16 is provided between the second monitoring circuit 15 and the freewheeling circuit 13, and includes a transistor 161, a zener diode 162, and a diode 163.

The transistor 161 is a PNP bipolar transistor, for example, and the emitter of the transistor 161 is connected to the collector of the transistor 152 in the second monitoring circuit 15, the collector is connected to the gate of the FET 132 in the freewheeling circuit 13 via the resistor 133, and the base is connected to the ground line GL2 via a resistor 164, the zener diode 162, and the diode 163. The cathode of the zener diode 162 is connected to the base of the transistor 161 via the resistor 164, and the anode is connected to the ground line GL2 via the diode 163. In addition, the anode of the diode 163 is connected to the anode of the zener diode 162, and the cathode is connected to the ground line GL2. In addition, a resistor 165 is connected between the base and emitter of the transistor 161.

As described above, it is one characteristic of the load drive circuit 10 according to this embodiment that the SGND terminal G1 to which the control circuit 11 is connected is provided separately from the PGND terminal G2 to which the freewheeling circuit 13 is connected, and that they are connected to different earth points.

In addition, the second monitoring circuit 15 and the third monitoring circuit 16 are connected to the power source 1 and the freewheeling circuit 13, and when they are properly connected, supply a power source voltage to the gate of the FET 132 of the freewheeling circuit 13 in response to a freewheeling circuit control signal that is output from the control circuit 11. Furthermore, the first monitoring circuit 14 is connected to the SGND terminal G1 and the PGND terminal G2, and has a function of detecting a rise in the potential difference between the SGND terminal G1 and the PGND terminal G2, and blocking supply of a power source voltage to the gate of the FET 132 of the freewheeling circuit 13.

Furthermore, in the load drive circuit 10 according to this embodiment, when the semiconductor switch 12 is switched from on to off in a state where the FET 132 of the freewheeling circuit 13 is switched off, a potential difference V3 that occurs in the semiconductor switch 12 due to induced electromotive force of the load 2 is limited to the sum (Vzd+Vf4) of the clamp voltage Vzd of the zener diode 17 and the forward voltage Vf4 of the freewheeling diode 131.

Operations of the load drive circuit 10 will be described below.

Figure 2:
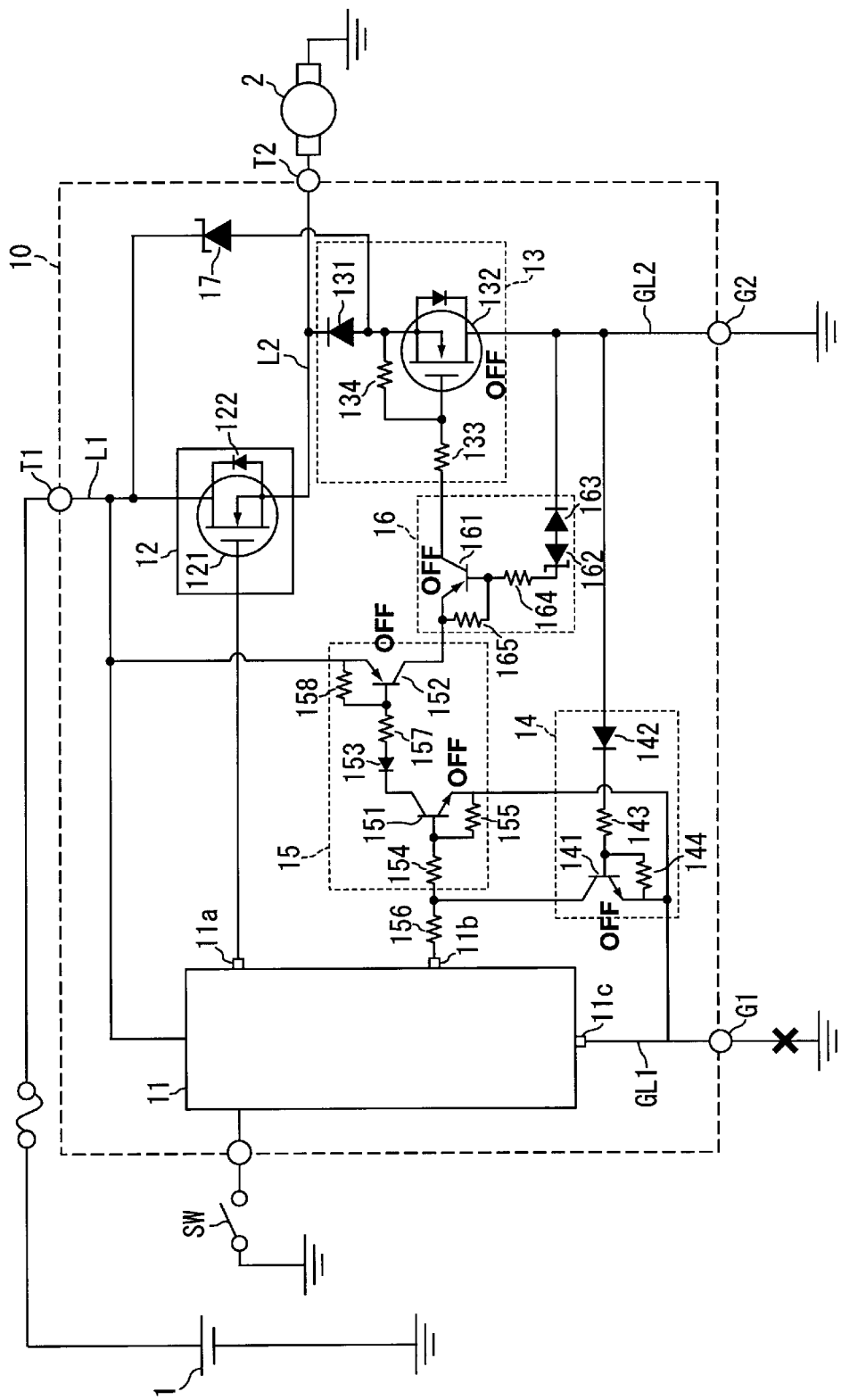
FIG. 2 is an explanatory diagram illustrating operations of the load drive circuit when a signal ground is detached.

FIG. 2 is an explanatory diagram illustrating operations of the load drive circuit 10 when the signal ground is detached. FIG. 2 shows a state where the SGND terminal G1 is detached from the earth point. In this case, as a result of the ground potential rising according to an internal impedance of the control circuit 11, the control circuit 11 is reset. In this case, the control circuit 11 does not output a freewheeling circuit control signal, and thus the two transistors 151 and 152 of the second monitoring circuit 15 and the transistor 161 of the third monitoring circuit 16 are all switched off. As a result, a power source voltage is not supplied to the freewheeling circuit 13, and thus the FET 132 of the freewheeling circuit 13 is switched off.

In a conventional load drive circuit, if a ground terminal is detached when the semiconductor switch is in an on-state, a ground potential rises according to an impedance in the control circuit, and the circuit is reset, thereby switching off the semiconductor switch. At this time, the freewheeling diode of the freewheeling circuit is not connected to earth via a FET, and thus a negative voltage that is generated in the power source output line when the semiconductor switch is turned off cannot be limited to the forward voltage of the freewheeling diode, and a negative voltage due to the induced electromotive force of the load occurs in the power source output line. Accordingly, there is a concern that a voltage that is applied between the drain and source of the semiconductor switch will exceed the voltage that the semiconductor switch can withstand.

In addition, since the semiconductor switch is in an off-state, the potential on the power source output line changes to an earth potential via the load, but the ground potentials of the load drive circuit and the control circuit are determined by the freewheeling circuit and the load, and there is the possibility that the semiconductor switch will be switched on again. In this case, the voltage in the power source output line rises to the power source voltage (for example, 12 V), and thus the control circuit is reset again as the ground potential rises. There is the possibility that, as a result of repeating such an operation, the load drive circuit will enter an oscillating state and a potential difference due to induced electromotive force of the load will continuously occur in the power source output line, thereby damaging the semiconductor switch.

However, in the load drive circuit 10 according to this embodiment, if the SGND terminal G1 to which the control circuit 11 is connected is detached from the earth point, it is possible to switch off the FET 132 of the freewheeling circuit 13. If the semiconductor switch 12 is switched from on to off in a state where the FET 132 of the freewheeling circuit 13 is switched off, a potential difference that occurs in the semiconductor switch 12 due to induced electromotive force of the load 2 is limited to the sum Vzd+Vf4 of the clamp voltage Vzd of the zener diode 17 and the forward voltage Vf4 of the freewheeling diode 131, and thus the above-mentioned oscillating state can be prevented.

Figure 3:
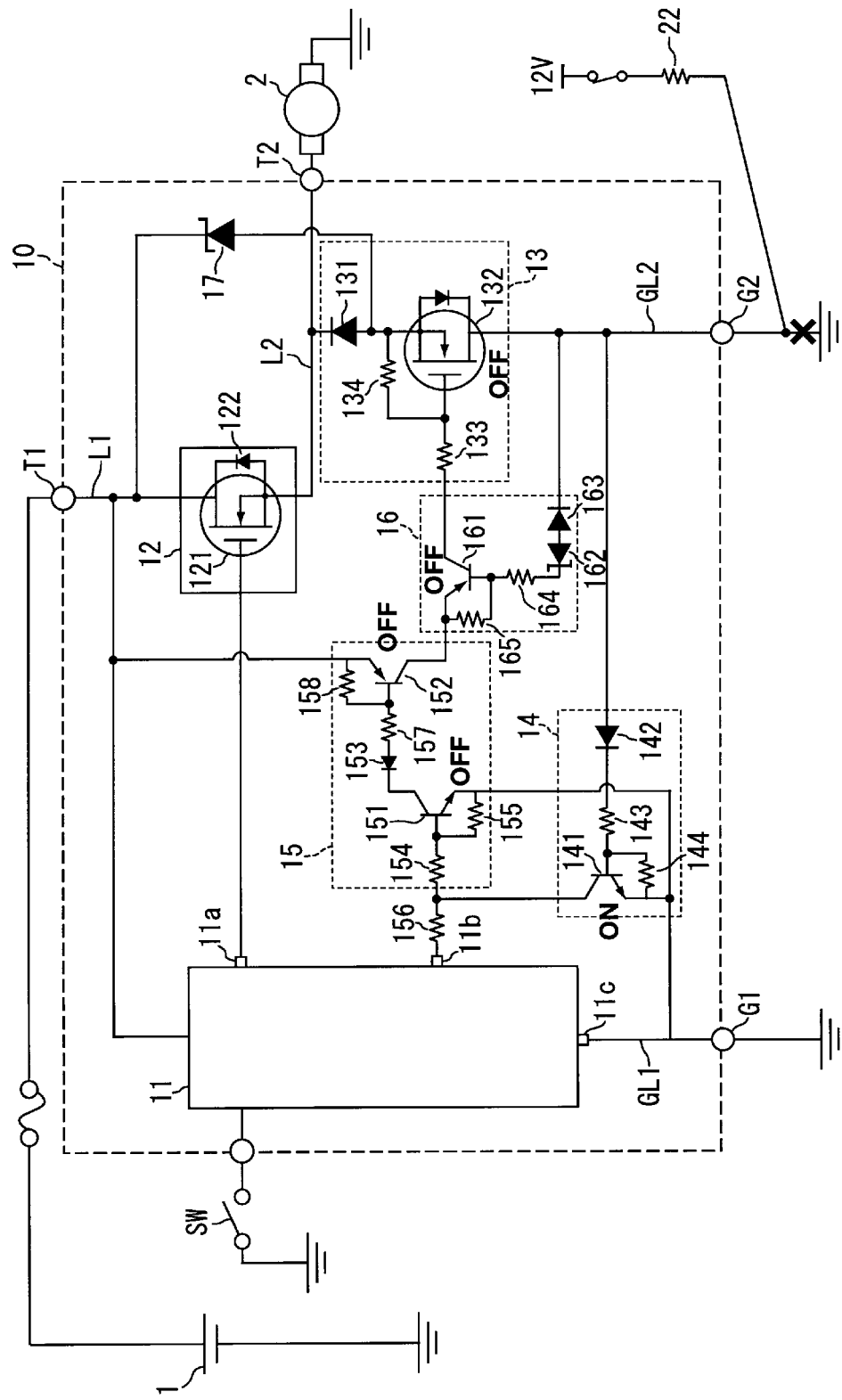
FIG. 3 is an explanatory diagram illustrating operations of the load drive circuit when a power ground is detached.

FIG. 3 is an explanatory diagram illustrating operations of the load drive circuit 10 when the power ground is detached. FIG. 3 shows a state where the PGND terminal G2 is detached from the earth point in a state where a common splice load 22 is fastened at the same earth point (second earth point) as the PGND terminal G2 using a earth bolt. In this case, the potential at the PGND terminal G2 rises depending on the resistance ratio of the common splice load 22 to the load 2.

The first monitoring circuit 14 is configured to detect the potential difference between the SGND terminal G1 and the PGND terminal G2 and switch on the transistor 141, and thus, when the potential at the PGND terminal G2 rises, a freewheeling circuit control signal that is output from the control circuit 11 through the control terminal lib is output to the outside of the load drive circuit 10 through the transistor 141 and the SGND terminal G1, and is not transmitted to the second monitoring circuit 15. As a result, the two transistors 151 and 152 of the second monitoring circuit 15 and the transistor 161 of the third monitoring circuit 16 are all switched off, and a power source voltage is not supplied to the freewheeling circuit 13, and thus the FET 132 of the freewheeling circuit 13 is switched off.

When the PGND terminal G2 is detached from the earth point in a state where the common splice load 22 is fastened at the same earth point as the PGND terminal G2 using an earth bolt, there is the possibility that a flyback current from the common splice load 22 to the load 2 via the freewheeling circuit 13 will cause damage in the freewheeling diode 131 (or the FET 132).

However, in the load drive circuit 10 according to this embodiment, a rise in the potential that occurs when the PGND terminal G2 is detached from the earth point is detected and control is performed so as to switch off the FET 132 of the freewheeling circuit 13, and thus it is possible to avoid the above-mentioned flyback current from the common splice load 22 to the load 2, and prevent the freewheeling diode 131 (or the FET 132) from being damaged.

Figure 4:
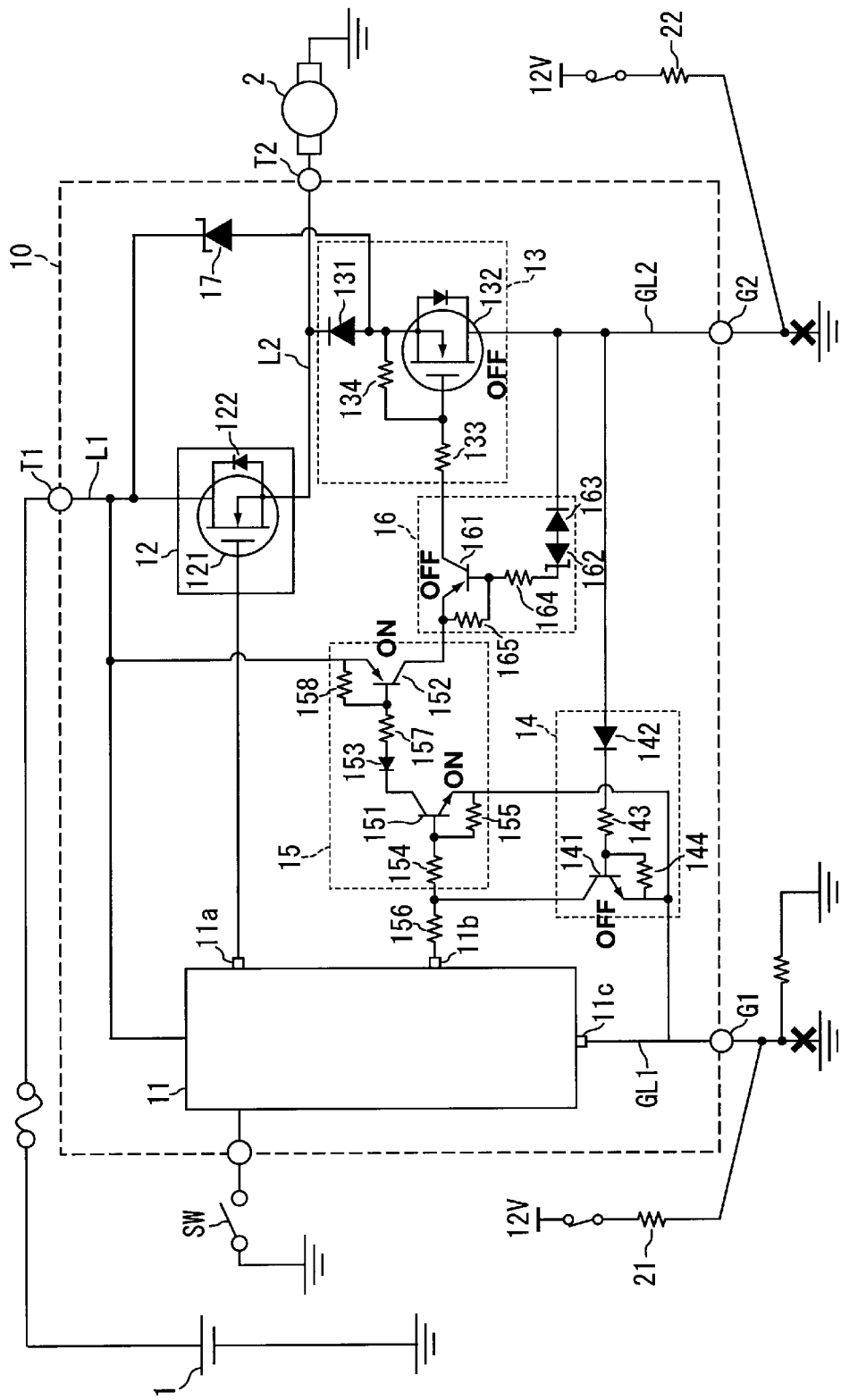
FIG. 4 is an explanatory diagram illustrating operations of the load drive circuit when both the signal ground and the power ground are detached.

FIG. 4 is an explanatory diagram illustrating operations of a load drive circuit when both a signal ground and a power ground are detached. FIG. 4 shows a state where the SGND terminal G1 is detached from the earth point in a state where a common splice load 21 is fastened at the same earth point (the first earth point) as the SGND terminal G1 using an earth bolt, and the PGND terminal G2 is detached from the earth point in a state where the common splice load 22 is fastened at the same earth point (second earth point) as the PGND terminal G2 using an earth bolt. A case is envisioned in which, at this time, the potential at the SGND terminal G1 rose to an extent where the control circuit 11 is not reset and the transistor 141 of the first monitoring circuit 14 is not switched on due to the potential difference between the SGND terminal G1 and the PGND terminal G2.

In this case, the conductive path between the control terminal lib and the SGND terminal G1 of the control circuit 11 is blocked by the transistor 141, and thus a freewheeling circuit control signal that is output from the control terminal lib is transmitted to the second monitoring circuit 15. The two transistors 151 and 152 of the second monitoring circuit 15 are switched on according to the freewheeling circuit control signal, and a power source voltage is transmitted to the third monitoring circuit 16. Note that the third monitoring circuit 16 detects a decrease in the potential difference between the power source 1 and the PGND terminal G2, and switches off the transistor 161. As a result, the power source voltage is not supplied from the third monitoring circuit 16 to the freewheeling circuit 13, and the FET 132 of the freewheeling circuit 13 is switched off.

Note that the third monitoring circuit 16 detects the potential difference between the power source 1 and the PGND terminal G2, and thus, also when the ground is connected properly, if the potential difference between the power source 1 and the PGND terminal G2 falls below a blocking threshold value due to a decrease in the power source voltage, there is the possibility that a blocking operation will be performed. Thus, the blocking threshold value of the third monitoring circuit 16 is preferably set in consideration of specifications related to the range of a power source voltage that is applied to the load drive circuit 10.

In the load drive circuit 10 according to this embodiment, even when the control circuit 11 can transmit a freewheeling circuit control signal to the second monitoring circuit 15, if both the SGND terminal G1 and the PGND terminal G2 are detached from earth, and a decrease in the potential difference between the power source 1 and the PGND terminal G2 can be detected, the FET 132 of the freewheeling circuit 13 can be switched off, and thus it is possible to avoid a flyback current from the common splice load 22 to the load 2, and prevent the freewheeling diode 131 (or the FET 132) from being damaged.

As described above, in the load drive circuit 10 according to this embodiment, even if a ground terminal (the SGND terminal G1, the PGND terminal G2) is detached from the earth point, it is possible to prevent the semiconductor switch 12 from deteriorating or being damaged due to induced electromotive force caused by the load 2. In addition, it is possible to prevent the freewheeling diode 131 from deteriorating and being damaged due to flyback from the common splice loads 21 and 22.

In addition, it is possible to eliminate the above-mentioned concern about flyback resulting from commonly splicing a large number of load grounds at an earth point, and thus it is possible to contribute to integration of splices (reduction in earth points).

Furthermore, the zener diode 17 can also be used as a conventional positive surge protection element (for example, an element in a vehicle system used for measures against load dump), and it is possible to contribute to both merchantability and robustness while preventing an increase in the cost for measures against ground detachment.

Second Embodiment

Figure 5:
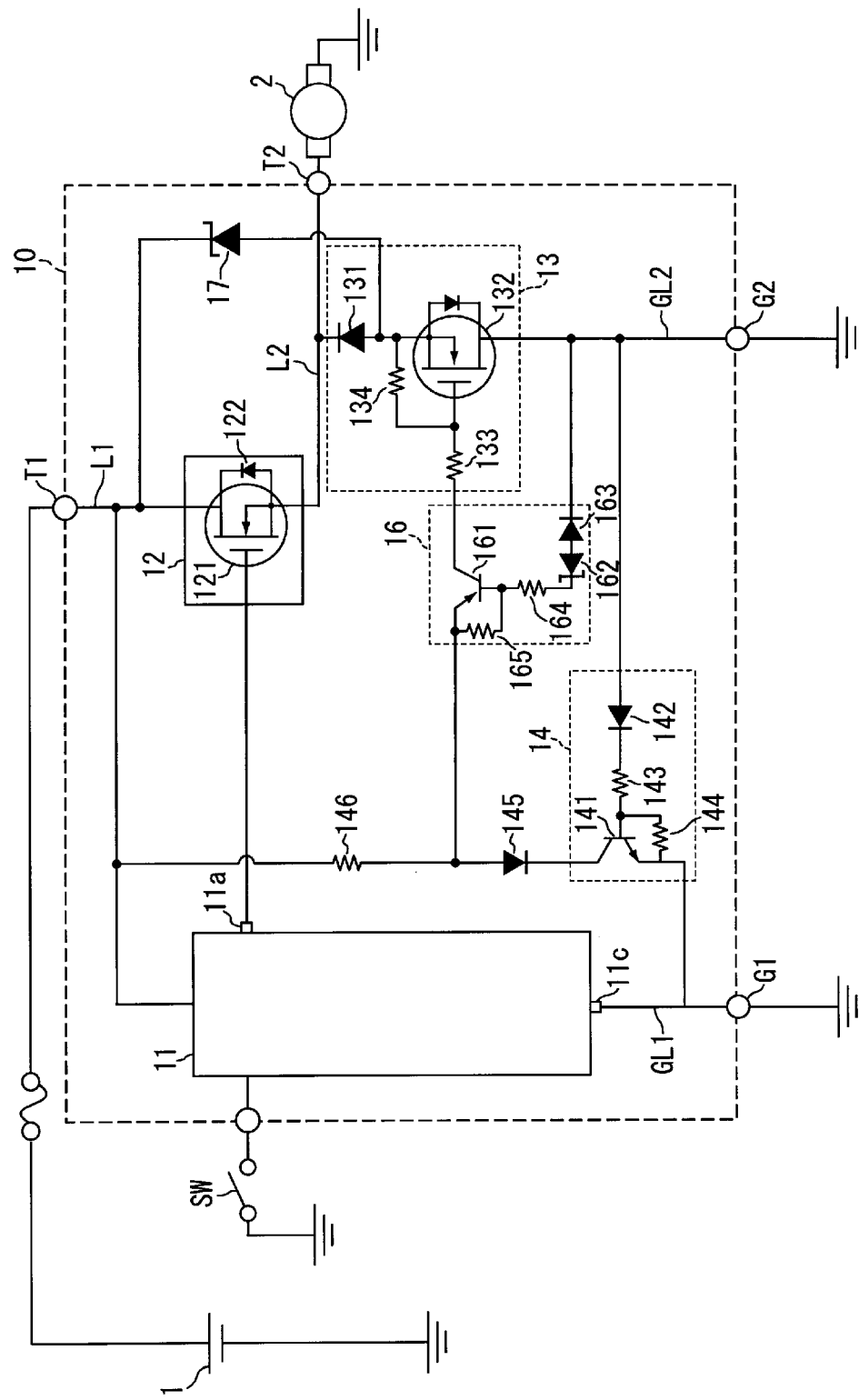
FIG. 5 is a circuit diagram showing a configuration of a load drive circuit according to a second embodiment.

FIG. 5 is a circuit diagram showing a configuration of a load drive circuit 10 according to a second embodiment. The load drive circuit 10 according to the second embodiment has a circuit configuration of the load drive circuit 10 described in the first embodiment without the second monitoring circuit 15, and includes e.g. a control circuit 11, a semiconductor switch 12, a freewheeling circuit 13, a first monitoring circuit 14, a third monitoring circuit 16, a zener diode 17. Note that the collector of a transistor 141 of the first monitoring circuit 14 is connected to a power source input line L1 via a diode 145 and a resistor 146.

In the circuit configuration shown in FIG. 5 as well, it is possible to prevent a freewheeling diode 131 from deteriorating and being damaged due to the flyback current from common splice loads 21 and 22.

For example, the first monitoring circuit 14 can detect a rise in the potential that occurs when a PGND terminal G2 is detached from an earth point, and switch off a FET 132 of the freewheeling circuit 13, and thus it is possible to avoid the flyback current from the common splice load 22 to a load 2 that has been described in the first embodiment, and prevent the freewheeling diode 131 (or the FET 132) from being damaged.

In addition, when both the SGND terminal G1 and the PGND terminal G2 are detached from earth points, if the third monitoring circuit 16 can detect a decrease in the potential difference between a power source 1 and the PGND terminal G2, the FET 132 of the freewheeling circuit 13 can be switched off, and thus it is possible to avoid the flyback current from the common splice load 22 to the load 2, and prevent the freewheeling diode 131 (or the FET 132) from being damaged.

The disclosed embodiments are to be considered as illustrative and non-limiting in all aspects. The scope of the present disclosure is indicated not by the above-stated meanings but by the scope of claims, and is intended to include all modifications that are within the meanings and the scope that are equivalent to those of the scope of claims.

The invention claimed is:

1. A load drive circuit for preventing a flyback current from a common splice load, the load circuit comprising:
   a power source terminal for connecting a power source;
   a load terminal for connecting a load to which power is to be supplied from the power source connected to the power source terminal;
   a semiconductor switch connected between the power source terminal and the load terminal;
   a freewheeling circuit that includes:
      a freewheeling diode connected to the semiconductor switch, and
      a protection switch that is connected to the freewheeling diode in series, and, when the power source is connected in a reverse manner, switches off and blocks flow of a current from the power source to the semiconductor switch via the freewheeling diode;
   a control circuit that includes:
      a first control terminal for outputting a signal for opening/closing the semiconductor switch, and
      a second control terminal for outputting a signal for opening/closing the protection switch;
   a first terminal for connecting the control circuit to a first fixed potential;
   a second terminal for connecting an anode of the freewheeling diode to a second fixed potential via the protection switch, wherein the common splice load is also connected to the second terminal; and
   a connection circuit that includes a connection switch installed in a conductive path that connects the second control terminal and the first terminal,
   wherein, when a rise in a potential difference between the first terminal and the second terminal is detected, the connection circuit connects the second control terminal and the first terminal by switching on the connection switch so as to prevent the flyback current from the common splice load to the freewheeling diode.

2. The load drive circuit according to claim 1, wherein the connection circuit detects a rise in a potential difference that occurs when connection between the second terminal and the second fixed potential is cancelled.

3. The load drive circuit according to claim 2, comprising:
   a zener diode connected between the protection switch and the power source terminal.

4. The load drive circuit according to claim 1, comprising:
   a first blocking circuit that is provided between the second control terminal and the freewheeling circuit, and switches off the protection switch when connection between the first terminal and the first fixed potential is cancelled.

5. The load drive circuit according to claim 4, further comprising:
   a second blocking circuit that is provided between the first blocking circuit and the freewheeling circuit, and, when a decrease in a potential difference between the power source terminal and the second terminal is detected, switches off the protection switch.

6. The load drive circuit according to claim 5, comprising:
   a zener diode connected between the protection switch and the power source terminal.

7. The load drive circuit according to claim 4, comprising:
   a zener diode connected between the protection switch and the power source terminal.

8. The load drive circuit according to claim 1, comprising:
   a zener diode connected between the protection switch and the power source terminal.

* * * * *